United States Patent [19]

Ito

[11] Patent Number: 4,763,176

[45] Date of Patent: Aug. 9, 1988

[54] METAL-SEMICONDUCTOR-METAL SCHOTTKY PHOTODIODE

[75] Inventor: Masanori Ito, Sagamihara, Japan

[73] Assignee: Fujitsu Limited, Kawasaki, Japan

[21] Appl. No.: 1,031

[22] Filed: Jan. 7, 1987

[30] Foreign Application Priority Data

Jan. 8, 1986 [JP] Japan .................................. 61-000776

[51] Int. Cl.$^4$ ..................... H01L 29/48; H01L 27/14; H01L 23/48
[52] U.S. Cl. ........................................ 357/15; 357/30; 357/71; 357/67
[58] Field of Search ...................... 357/15, 30 B, 30 C, 357/30 J, 30 P, 71 S, 67 S

[56] References Cited

U.S. PATENT DOCUMENTS

| | | | |
|---|---|---|---|
| 3,700,980 | 11/1972 | Belasco et al. | 357/30 |
| 4,345,107 | 8/1982 | Fulop et al. | 357/15 |
| 4,514,579 | 4/1985 | Hanak | 357/30 |

FOREIGN PATENT DOCUMENTS

| | | | |
|---|---|---|---|
| 0063421 | 11/1982 | European Pat. Off. | 357/30 |
| 0050288 | 4/1979 | Japan | 357/30 |
| 1082358 | 9/1967 | United Kingdom | 357/30 C |

OTHER PUBLICATIONS

S. P. Murarka, "Refractory . . . Circuits", J. Vac. Sci. Tech., 17(4), Jul./Aug., 1980, pp. 775–792.

*Primary Examiner*—Martin H. Edlow
*Assistant Examiner*—Donald J. Featherstone
*Attorney, Agent, or Firm*—Staas & Halsey

[57] ABSTRACT

A metal-semiconductor-metal photodiode comprises a semiconductor layer and a cathode electrode and an anode electrode which are formed on the semiconductor layer and are made of such mutually different electrode materials that the cathode electrode has a Schottky barrier height $\phi_{bn}$ from a conduction band satisfying $\phi_{bn} > Eg/2$ and the anode electrode has a Schottky barrier height $\phi_{bp}$ from a valence band satisfying $\phi_{bp} > Eg/2$, where Eg denotes the energy band gap.

8 Claims, 4 Drawing Sheets

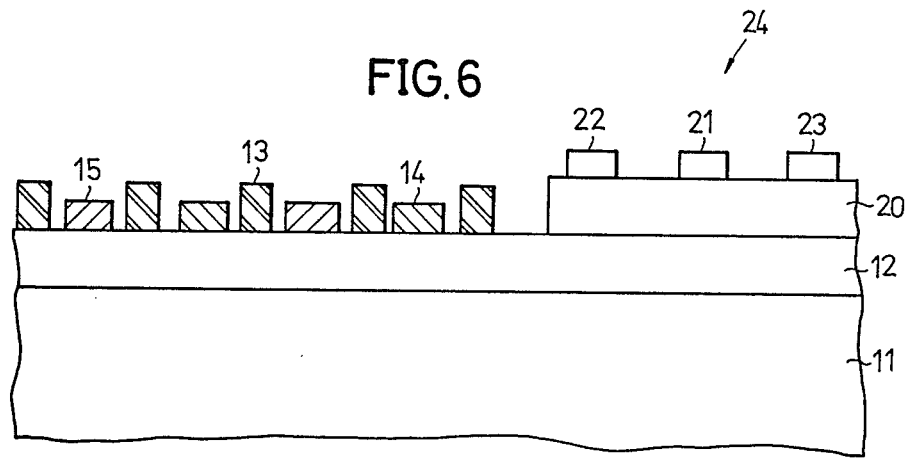
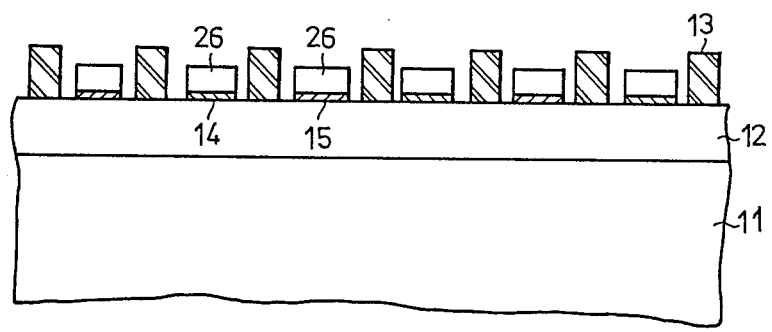

METAL-SEMICONDUCTOR-METAL SCHOTTKY PHOTODIODE

BACKGROUND OF THE INVENTION

The present invention generally relates to metal-semiconductor-metal photodiodes, and more particularly to a metal-semiconductor-metal photodiode in which a dark current is minimized.

Generally, a metal-semiconductor-metal (MSM) photodiode is suited for forming a semiconductor device by integration with transistors. The present inventor has previously proposed in Japanese Patent Application No. 60-111376 an MSM photodiode in which dark current is reduced. According to the previously proposed MSM photodiode, tungsten silicide ($WSi_x$) is used as the material for the electrodes of the MSM photodiode so as to reduce the dark current and to obtain a signal reception system which can receive signals with a satisfactory signal-to-noise ratio.

The previously proposed MSM photodiode is advantageous in that dark current is reduced and the signal reception system can receive signals with a satisfactory signal-to-noise ratio. But in the previously proposed MSM photodiode, the same electrode material is used for both anode and cathode electrodes of the MSM photodiode, and compromise is necessary when selecting the electrode material. In other words, when the Schottky barrier height from the conduction band is high, the injection electrodes are in small numbers but the injection holes are in large numbers. On the other hand, when the Schottky barrier height from the conduction band is low, the injection holes are in small numbers but the injection electrons are in large numbers. Hence, $WSi_x$ is used as the electrode material for both the anode and the cathode electrodes of the MSM photodiode. However, it would be more advantageous if it were possible to further reduce the dark current.

SUMMARY OF THE INVENTION

Accordingly, it is a general object of the present invention to provide a novel and useful MSM photodiode in which the above described demands are satisfied.

Another and more specific object of the present invention is to provide an MSM photodiode in which the electrode materials for the anode electrode and the cathode electrode of the MSM photodiode are selected from such different and appropriate materials that dark current is minimized. The MSM photodiode of the present invention makes it possible to obtain a signal reception system for receiving signals with a satisfactory signal-to-noise ratio.

Still another object of the present invention is to provide an MSM photodiode having a cathode electrode and an anode electrode which are made of such mutually different electrode materials that the cathode electrode has a Schottky barrier height $\phi_{bn}$ satisfying $\phi_{bn} > Eg/2$ and the anode electrode has a Schottky barrier height $\phi_{bp}$ satisfying $\phi_{bp} > Eg/2$, where Eg denotes the energy band gap. Through the use of the MSM photodiode of the present invention, it is possible to obtain a large current when the MSM photodiode receives an optical signal. Hence, it is possible to greatly reduce the dark current and to obtain a signal reception system for receiving signals with a satisfactory signal-to-noise ratio.

A further object of the present invention is to provide an MSM photodiode in which at least one of the cathode electrode and the anode electrode has a relatively small film thickness and an indium tin oxide (ITO) or indium oxide ($InO_x$) layer is formed on the electrode with a relatively small film thickness. According to the MSM photodiode of the present invention, it is possible to improve the sensitivity of the MSM photodiode.

Other objects and further features of the present invention will be apparent from the following detailed description when read in conjunction with the accompanying drawings.

BRIEF DESCRIPTION OF THE DRAWINGS

FIG. 6 is a cross sectional view showing an application of an MSM photodiode which embodies the present invention; and FIG. 7 is a cross sectional view showing another embodiment of an MSM photodiode constructed in accordance with the present invention.

DETAILED DESCRIPTION

Figure 1:
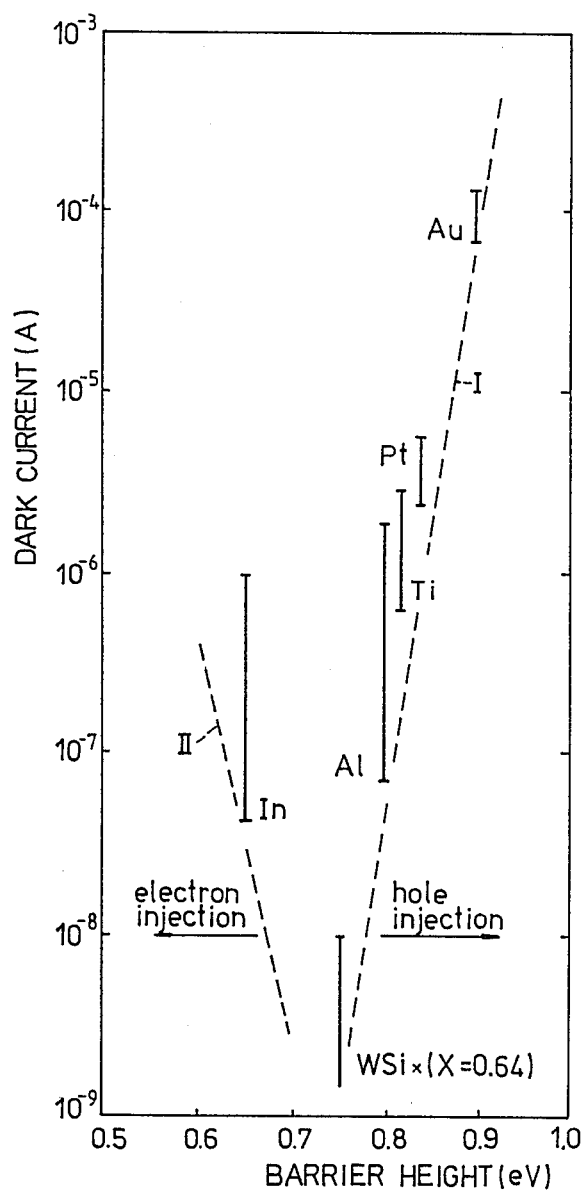
FIG. 1 shows the relationships between dark current and barrier height.

According to the previously proposed MSM photodiode described above, $WSi_x$ is used as the electrode material for the MSM photodiode so as to reduce the dark current and obtain a signal reception system which can receive signals with a satisfactory signal-to-noise ratio. FIG. 1 shows the relationships between the dark current and the Schottky barrier height which are essentially the experimental results obtained when the previously proposed MSM photodiode was devised. In FIG. 1, the abscissa indicates the barrier height which is dependent on the metal of the electrodes of the MSM photodiode, and the ordinate indicates the dark current in the MSM photodiode. Furthermore, the Schottky barrier height is shown for the case where each metal electrode is formed from an n-type gallium arsenide (GaAs) layer, and the bias voltage is 10 volts. As may be seen from FIG. 1, the dark current has the smallest value when $WSi_x$ is used as the electrode material. In FIG. 1, phantom lines I and II indicate characteristics which are obtained by connecting minimum values of the dark current for the various electrode materials.

Figure 2:
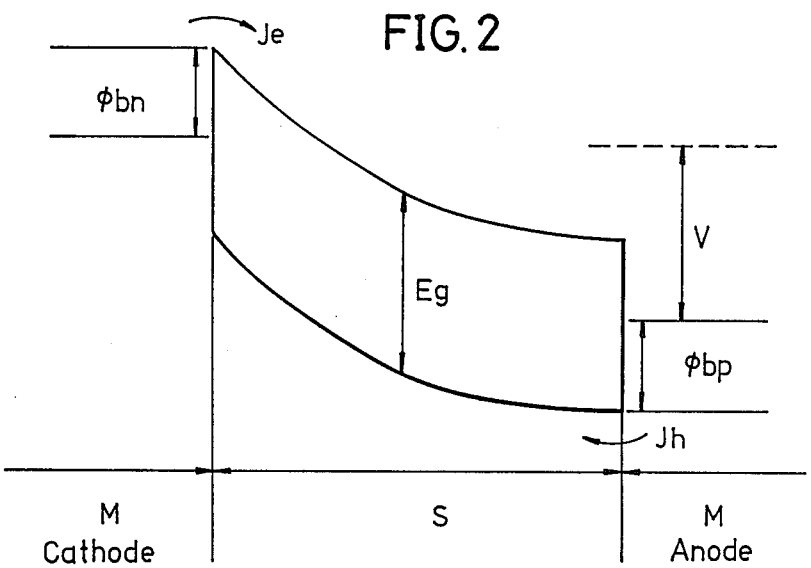
FIG. 2 is a diagram showing the energy band of the previously proposed MSM photodiode.

FIG. 2 illustrates the energy band diagram of the previously proposed MSM photodiode. In FIG. 2, M denotes the metal electrode, S denotes the semiconductor layer, V denotes the bias voltage, $\phi_{bn}$ denotes the Schottky barrier height from the conduction band, $\phi_{bp}$ denotes the Schottky barrier height from the valence band, $j_e$ denotes injection electrons and $j_h$ denotes injection holes. When the barrier height $\phi_{bn}$ is high, the injection electrons $j_e$ are in small numbers, but the injection holes $j_h$ are in large numbers because $\phi_{bp} = Eg - \phi_{bn}$, where Eg denotes the energy band gap. On the other hand, when the carrier height $\phi_{bn}$ is low, the injection holes $j_h$ are in small numbers but the injection electrons $j_e$ are in large numbers.

Accordingly, best results can be obtained when $\phi_{bn} \approx Eg/2$, and $WSi_x$ is a metal which satisfies this condition TM By using $WSi_x$ as the electrode material of the MSM photodiode, it is possible to considerably reduce the dark current compared to the case where a metal such as aluminum (Al) is used as the electrode material.

The previously proposed MSM photodiode is advantageous in that the dark current is reduced and the signal reception system can receive signals with a satisfactory signal-to-noise ratio. But in the previously proposed MSM photodiode, the same electrode material is used for both anode and cathode electrodes of the MSM photodiode, and compromise is necessary when selecting the electrode material. Hence, $WSi_x$ is used as the electrode material for both the anode and the cathode electrodes of the MSM photodiode. However, it would be more advantageous if it were possible to further reduce the dark current.

The present invention uses different electrode materials for the anode and the cathode electrodes respectively of the MSM photodiode so as to further reduce the dark current as compared to the previously proposed MSM photodiode.

Generally, the injection electrons $j_e$ and the injection holes $j_h$ in the MSM photodiode can be described by the following relations, where $An^*$ and $Ap^*$ denote the Richardson constants, T denotes the absolute temperature, q denotes the electron charge, k denotes the Boltzmann constant, and $\Delta\phi_{bn}$ and $\Delta\phi_{bp}$ denote the deviation in the respective barrier heights $\phi_{bn}$ and $\phi_{bp}$. The terms $e^{q\Delta\phi_{bn}/kT}$ and $e^{q\Delta\phi_{bp}/kT}$ occur due to the decrease in the barrier heights when the bias voltage changes, and have virtually no effects.

$$j_e \propto An^* T^2 e^{-q\phi_{bn}/kT} \cdot e^{q\Delta\phi_{bn}/kT}$$

$$j_h \propto Ap^* T^2 e^{-q\phi_{bp}/kT} \cdot e^{q\Delta\phi_{bp}/kT}$$

As may be seen from the above relations, in order to increase the injection electrons or the injection holes to reduce the dark current, the barrier heights $\phi_{bn}$ and $\phi_{bp}$ should increased. In the previously proposed MSM photodiode, the barrier height is approximately $Eg/2$, and in order to increase the injection electrons or the injection holes compared to such case, the barrier heights $\phi_{bn}$ and $\phi_{bp}$ must satisfy $\phi_{bn} > Eg/2$ and $\phi_{bp} > Eg/2$. Therefore, in the MSM photodiode according to the present invention, the cathode and the anode electrodes of the MSM photodiode are made of such mutually different electrode materials (for example, Au and In) that the cathode electrode has a barrier height $\phi_{bn}$ satisfying $\phi_{bn} > Eg/2$ and the anode electrode has a barrier height $\phi_{bp}$ satisfying $\phi_{bp} > Eg/2$. In the MSM photodiode of the present invention, since each of the barrier heights $\phi_{bn}$ and $\phi_{bp}$ is high enough to avoid thermal emission of carriers like $j_e$ and $j_h$, it is possible to greatly reduce the dark current. On the other hand, since the barrier heights $\phi_{bn}$ and $\phi_{bp}$ have little relationship to the produced current when the MSM photodiode receives an optical signal, it is possible to reduce the dark current without reducing the current responsive to the optical signal. Therefore, it is possible to obtain a signal reception system for receiving signals with a satisfactory signal-to-noise ratio.

In order to make the barrier height $\phi_{bn}$ on the cathode side of the MSM photodiode greater than $Eg/2$, a material such as gold (Au), platinum (Pt), titanium (Ti) of aluminum (Al) is used as the electrode material for the cathode electrode. On the other hand, in order to make the barrier height $\phi_{bp}$ on the anode side of the MSM photodiode greater than $Eg/2$, a material such as indium (In) or a tungsten silicide ($WSi_x$) is used as the electrode material for the anode electrode, where x is in the range of 0.5 to 0.8, and x=0.64, for example.

Figure 3:
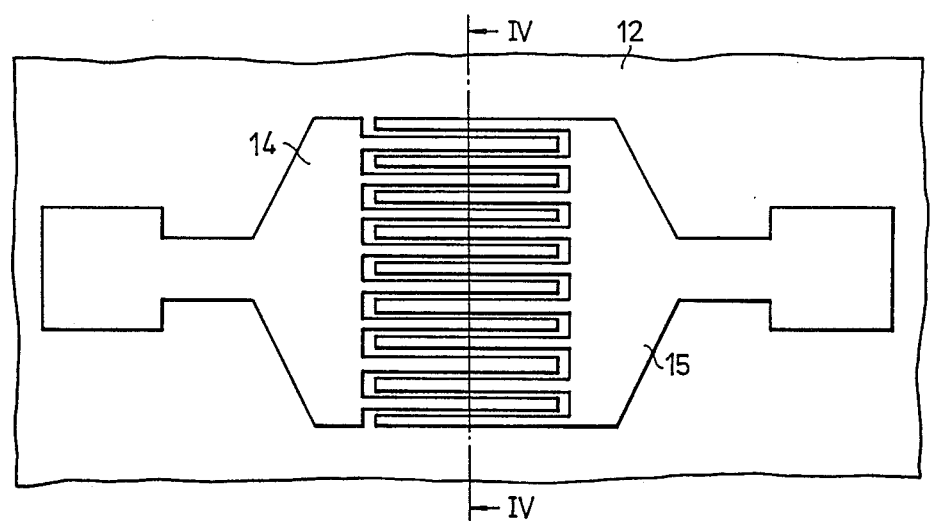
FIG. 3 is a plan view showing an essential part of an embodiment of an MSM photodiode according to the present invention.

FIG. 3 is a plan view showing an essential part of an embodiment of an MSM photodiode according to the present invention. In FIG. 3, the MSM photodiode comprises a GaAs active layer 12, a cathode electrode 14 made of Au, and an anode electrode 15 made of In.

Figure 4:
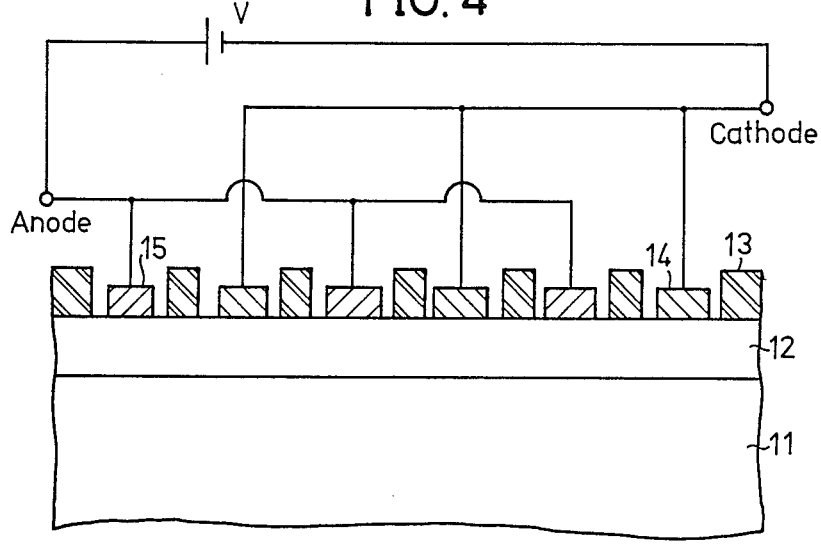
FIG. 4 is a cross sectional view of the MSM photodiode of FIG. 3 taken along a line IV—IV in FIG. 3.

FIG. 4 is a cross sectional view of the MSM photodiode taken along line IV—IV in FIG. 3. In FIG. 4, parts which are the same as the corresponding parts in FIG. 3 will be designated by the same reference numerals.

In FIG. 4, the active GaAs layer 12 is formed on a semiinsulating GaAs substrate 11, and a silicon nitride (SiN) layer 13 is formed on the active GaAs layer 12. A bias voltage V is applied across the anode and the cathode as shown. In the MSM photodiode shown in FIGS. 3 and 4, light impinges on the areas between the cathode and anode electrodes 14 and 15 which are arranged in the form of the teeth of a comb.

Figure 5:
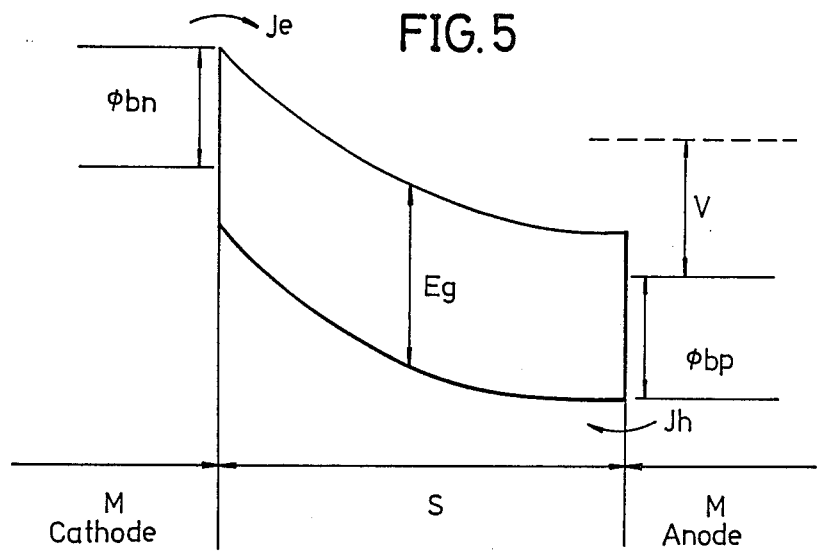
FIG. 5 is a diagram showing the energy band of the MSM photodiode of FIGS. 3 and 4.

FIG. 5 shows the energy band diagram of the MSM photodiode of FIGS. 3 and 4. In FIG. 5, parts which are the same as corresponding parts in FIG. 2 are designated by the same reference characters. As may be seen from FIG. 5, the cathode electrode has a barrier height $\phi_{bn}$ satisfying $\phi_{bn} > Eg/2$ and the anode electrode has a barrier height $\phi_{bp}$ satisfying $\phi_{bp} > Eg/2$. A bias voltage V is applied across the anode and the cathode as shown. Accordingly, the current which flows when the MSM photodiode receives light is large, and the dark current is greatly reduced. Compared to the previously proposed MSM photodiode, the dark current in the MSM photodiode according to the present invention is reduced to at least 1/10 the dark current of the previously proposed MSM photodiode. As a result, it is possible to obtain a signal reception system for receiving signals with a satisfactory signal-to-noise ratio.

FIG. 6 illustrates a case where the MSM photodiode shown in FIGS. 3 and 4 is combined with a transistor such as a metal semiconductor field effect transistor (MESFET) so as to constitute a semiconductor device. In FIG. 6, parts which are the same as corresponding parts in FIG. 4 are designated by the same reference numerals, and description thereof is omitted. In FIG. 6, an additional GaAs active layer 20 is formed on the GaAs active layer 12, and a Schottky gate electrode 21, an ohmic contact source 22 and an ohmic contact drain 23 are formed on the additional GaAs active layer 20. In this case, the GaAs active layer 12 in a MESFET portion 24 acts as a buffer layer.

FIG. 7 illustrates another embodiment of the MSM photodiode according to the present invention. In FIG. 7, those parts which are the same as corresponding parts in FIG. 4 are designated by the same reference numerals, and description thereof is omitted. In the FIG. 7 embodiment, the cathode and anode electrodes 14 and 15 have a small film thickness in the range of 50 Å to 100 Å, and an additional layer 26 which is made of indium tin oxide (ITO) or indium oxide ($InO_x$) and has a film thickness in the order of 2000 Å is formed on the cathode and anode electrodes 14 and 15, so as to effectively increase the sensitivity of the MSM photodiode. As in the case of the embodiment described before, the dark current is minimized in the present invention. Although it is more desirable to provide the additional layer 26 on both the cathode and anode electrodes 14 and 15, the additional layer 26 may be formed on only one of the cathode and anode electrodes 14 and 15.

Further, the present invention is not limited to these embodiments, but various variations and modifications may be made without departing from the scope of the present invention.

What is claimed is:

1. A metal-semiconductor-metal photodiode having reduced dark current characteristics comprising:

a semiconductor layer having an energy band gap Eg;

a cathode electrode formed on said semiconductor layer so as to form a first Schottky barrier with said semiconductor layer, said cathode electrode being made of a first electrode material having a first Schottky barrier height $\phi_{bn}$ from a conduction band of said semiconductor layer satisfying the relationship $\phi_{bn} > Eg/2$;

an anode electrode formed on said semiconductor layer so as to form a second Schottky barrier with said semiconductor layer, said anode electrode being made of a second electrode material different from said first electrode material and having a second Schottky barrier height $\phi_{bp}$ from a valence band of said semiconductor layer satisfying the relationship $\phi_{bp} > Eg/2$; and a bias voltage means, operatively connected between said cathode electrode and said anode electrode, for applying a bias voltage so as to make the voltage of said anode electrode higher than that of said cathode electrode.

2. A metal-semiconductor-metal photodiode as claimed in claim 1 in which said first electrode material is selected from a group of gold, platinum, titanium and aluminum, and said second electrode material is selected from a group of indium and tungsten silicide.

3. A metal-semiconductor-metal photodiode as claimed in claim 2 in which said second electrode material is $WSi_x$, where x is a range of 0.5 to 0.8.

4. A metal-semiconductor-metal photodiode as claimed in claim 1 which further comprises an additional layer formed on at least one of said cathode electrode and said anode electrode, said additional layer being made of a material selected from a group of indium tin oxide and indium oxide.

5. A metal-semiconductor-metal photodiode as claimed in claim 4 in which said additional layer has a film thickness in the order to 2000 Å, and said cathode electrode and/or said anode electrode having said additional layer formed thereon has a film thickness in a range of 50 Å to 100 Å.

6. A metal-semiconductor-metal photodiode as claimed in claim 1 in which said semiconductor layer is an active layer, said active layer being formed on a semiinsulating substrate.

7. A metal-semiconductor-metal photodiode as claimed in claim 6 in which said active layer is made of gallium arsenide.

8. A metal-semiconductor-metal photodiode as claimed in claim 6 in which said cathode electrode and said anode electrode are arranged on said active layer in the form of teeth of a comb so that teeth portions of said cathode electrode and said anode electrode occur alternately.

* * * * *

UNITED STATES PATENT AND TRADEMARK OFFICE
CERTIFICATE OF CORRECTION

PATENT NO. : 4,763,176
DATED : August 9, 1988
INVENTOR(S) : Masanori Ito

It is certified that error appears in the above-identified patent and that said Letters Patent is hereby corrected as shown below:

Column 3, line 3, "TM" should be a period --.--.

Signed and Sealed this

Sixth Day of December, 1988

Attest:

DONALD J. QUIGG

Attesting Officer

Commissioner of Patents and Trademarks